United States Patent
Horn et al.

(10) Patent No.: US 10,777,999 B2
(45) Date of Patent: Sep. 15, 2020

(54) DEVICE COMPRISING CHIP AND INTEGRATED CIRCUIT

(71) Applicant: Infineon Technologies AG, Neubiberg (DE)

(72) Inventors: Wolfgang Horn, Klagenfurt am Woerthersee (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 313 days.

(21) Appl. No.: 14/994,463

(22) Filed: Jan. 13, 2016

(65) Prior Publication Data

US 2016/0204602 A1 Jul. 14, 2016

(30) Foreign Application Priority Data

Jan. 13, 2015 (DE) .................. 10 2015 100 398

(51) Int. Cl.
   *H02H 3/24* (2006.01)
   *H01L 27/02* (2006.01)
   *H02H 7/20* (2006.01)
   *H02H 9/04* (2006.01)

(52) U.S. Cl.
   CPC ......... *H02H 3/243* (2013.01); *H01L 27/0248* (2013.01); *H02H 7/20* (2013.01); *H02H 9/046* (2013.01)

(58) Field of Classification Search
   CPC ....... H02H 9/04–046; H02H 3/24–243; H02H 7/10; H02H 7/20; H02H 9/00–028; H01L 27/0248
   See application file for complete search history.

(56) References Cited

U.S. PATENT DOCUMENTS

| | | | |
|---|---|---|---|
| 4,456,939 A | 6/1984 | Ozaki et al. | |
| 4,884,161 A * | 11/1989 | Atherton | G05F 1/571 361/18 |
| 5,376,920 A * | 12/1994 | Baily | G01R 19/155 324/133 |
| 2006/0158808 A1 | 7/2006 | Scheikl et al. | |
| 2007/0063340 A1 * | 3/2007 | Owyang | H01L 23/36 257/723 |
| 2008/0278133 A1 | 11/2008 | Lee | |
| 2009/0174387 A1 | 7/2009 | Yamaguchi et al. | |
| 2009/0268926 A1 | 10/2009 | Watanabe | |
| 2012/0313692 A1 * | 12/2012 | Sutardja | H01L 27/0794 327/535 |
| 2013/0021702 A1 * | 1/2013 | Waltman | H02H 3/24 361/91.1 |
| 2014/0307354 A1 * | 10/2014 | Watanabe | H02H 9/041 361/56 |
| 2015/0124361 A1 * | 5/2015 | Tsaur | H02H 9/041 361/56 |

OTHER PUBLICATIONS

Allen, P.E. et al. "Integrated Circuit Passive Components.", ECE 6421—Analog IC Design, IC Passive Components (Jan. 13, 2000). 60 pages.

* cited by examiner

*Primary Examiner* — Jared Fureman
*Assistant Examiner* — Christopher J Clark
(74) *Attorney, Agent, or Firm* — Eschweiler & Potashnik, LLC

(57) ABSTRACT

A device includes a chip and integrated circuit. Devices and integrated circuits are provided where a resistor is coupled to a terminal of a chip or integrated circuit.

15 Claims, 2 Drawing Sheets

DEVICE COMPRISING CHIP AND INTEGRATED CIRCUIT

CROSS REFERENCE TO RELATED APPLICATION

This application claims priority to German Patent Application number 102 015 100 398.8, filed Jan. 13, 2015, which is hereby incorporated by reference in its entirety.

FIELD

The present application relates to devices comprising chips and to integrated circuits and more particular to terminal circuits, i.e. circuits associated with a terminal of a chip or integrated circuit, and to corresponding devices.

BACKGROUND

Demands made to integrated circuits (monolithically integrated or integrated in a package) or other chips regarding electromagnetic compatibility (EMC) have been increasing over time. Compliance with EMC requirements is in particular important for safety critical applications, for example in the automotive field. For example, integrated circuits may be required to operate correctly even if a variety of disturbances like interference pulses, noise or similar events occur. For example, nowadays, correct functioning of a chip may be even required during a disturbance like a short break (also referred to as micro break) in a supply voltage or when short negative and low ohmic supply voltage peaks occur.

In conventional solutions, external components, for example external RC (resistor-capacitor) components are used, which may for example form a low pass filter filtering such disturbances. Such solutions are comparatively costly and prone to errors and may be difficult to implement for example due to space constraints. Other solutions use rectifying diodes and/or storing capacitors. Such solutions cause at least 0.6V dropout voltage, which limits the usage at low supply voltages.

SUMMARY

A device comprises a chip that comprises a terminal and a resistor. A first terminal of the resistor is coupled with the chip terminal and a second terminal of the resistor is coupled with further circuitry.

In one embodiment an integrated circuit is disclosed that comprises a supply voltage terminal and a resistor having a resistor value greater than 5 ohms. A first terminal of the resistor is directly coupled to the supply voltage terminal. The integrated circuit further comprises one of a capacitor terminal to be coupled to an external capacitor that is external to the integrated circuit, or an internal capacitor coupled to a second terminal of the resistor. The integrated circuit further comprises core circuitry implementing at least one function of the integrated circuit coupled to the second terminal of the resistor.

DETAILED DESCRIPTION

Figure 1:
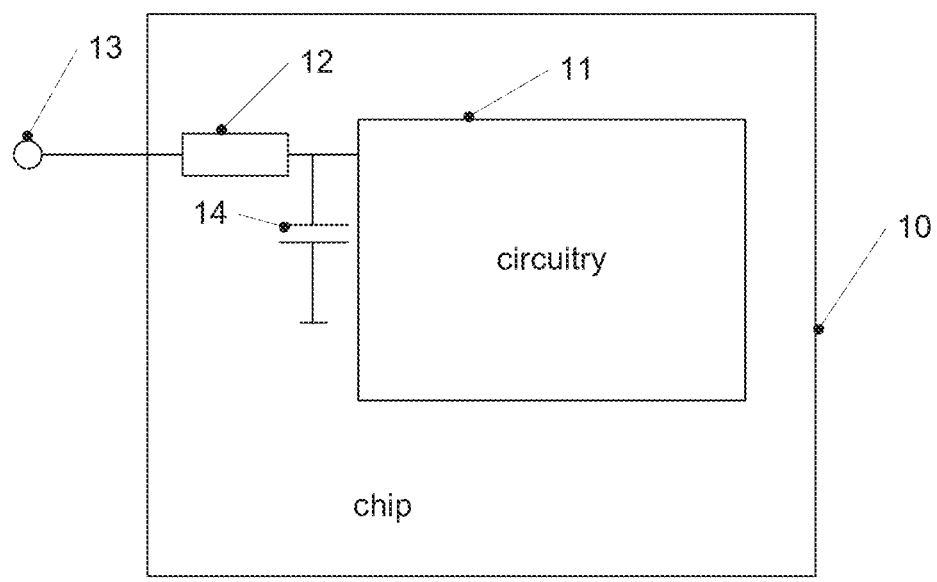
FIG. 1 is a block diagram of a device according to an embodiment.

In the following, various embodiments will be described in detail referring to the attached drawings. These embodiments serve illustrative purposes only and are not to be construed as limiting.

For example, while embodiments may be described comprising a plurality of features or elements, in other embodiments, some of these features or elements may be omitted and/or may be replaced by alternative features or elements. In yet other embodiments, additionally or alternatively additional features or elements apart from the ones explicitly described may be present.

Any connection or coupling shown in the drawings or described herein may be a direct connection or coupling, i.e. a connection or coupling without intervening elements, or an indirect connection or coupling, i.e. a connection or coupling comprising one or more additional intervening elements, as long as the general purpose of the respective connection or coupling, for example to transmit a certain kind of information or to transmit a certain kind of signal, is essentially maintained. On the other hand, the terms "direct connection", "directly connected" or the like are intended to indicate a connection without any additional intervening elements.

Features from different embodiments may be combined unless noted otherwise.

In some embodiments, a chip and/or integrated circuit may comprise a terminal. The terminal may for example be a supply voltage terminal (e.g. supply pin) like a terminal for a positive supply voltage, but is not limited thereto. The chip may comprise a resistor (also referred to as integrated resistor below). In some embodiments, the resistor may be a passive resistor with a resistance value greater than 5Ω, for example between 10 and 100Ω, for example about 30Ω. The resistor may be electrically isolated from the rest of the chip, for example by dielectric material to avoid clamping or breakthrough effects from active circuitry or protection devices. This in some embodiments allows much bigger disturbance voltages and may be only limited by dielectric isolation breakthrough voltages e.g. of some 100V and may help to sustain ESD pulses (e.g. as supplied by a so-called ESD (Electrostatic Discharge)-Gun during testing) without an additional blocking capacitor at the supply terminal. For example a Gun-ESD pulse with 8 kV may cause a current of approximately 5 A through a series connection of a Gun equipment resistor (e.g. about 150Ω) and the integrated resistor. To give an example, with a 30Ω integrated resistor and 5 A current a resulting voltage at the supply pin is only 150V on top of the internal breakthrough voltage of active circuits. This overvoltage at the supply terminal in embodiments is not a problem compared to dielectric breakthrough voltages.

A first terminal of the resistor may be coupled with the terminal of the chip, for example directly coupled with the terminal of the chip. In particular, in some embodiments, no ESD protection devices or other protection devices may be coupled between the terminal of the chip and the first terminal of the resistor. This in embodiments may avoid clamping effects at the supply terminal and following destruction of ESD protection devices in case of overvoltages, because overvoltages up to some 100V at the supply pin are decoupled from any active circuitry of the chip via the resistor. A second terminal of the resistor may be coupled with remaining circuitry of the chip, optionally including ESD protection circuitry, voltage regulators, core circuitry, sensor circuitry or the like. Additionally, a buffer capacitor may be coupled with the second terminal of the resistor. The buffer capacitor may be provided external to the chip. In other embodiments, the buffer capacitor may be integrated with the chip.

In some embodiments, charge stored in the buffer capacitor may be used to bridge short failures of a supply voltage at the terminal of the chip.

Turning now to the figures, in FIG. 1 a block diagram illustrating a device according to an embodiment is shown. The device of FIG. 1 comprises a chip 10 with a circuit, for example an integrated circuit, formed thereon. Chip 10 comprises a terminal 13. Terminal 13 may be a supply voltage terminal that receives a supply voltage, for example a positive supply voltage like VDD or a battery voltage, but is not limited thereto and may also be another kind of terminal, for example an input-output (I/O) terminal. While a single terminal 13 is shown for illustration purposes in FIG. 1, it is to be understood that chip 10 may comprise a plurality of terminals. Each of these terminals may, but need not, have associated terminal circuitry as illustrated in FIG. 1. In other embodiments, only one or some of the terminals of chip 10 may have such associated terminal circuitry.

In FIG. 1, such terminal circuitry comprises a resistor 12. A first terminal of resistor 12 is coupled with terminal 13. In the embodiment illustrated in FIG. 1, the first terminal of resistor 12 is directly coupled with terminal 13. For example, in some embodiments, no circuitry like ESD protection circuitry may be coupled between the first terminal of resistor 12 and terminal 13.

Resistor 12 may be a dielectrically insulated passive resistor, which may for example be formed in one or more metal layers of chip 10. For example, resistor 12 may be implemented in a highest metal layer or a combination of various metal layers. In some embodiments, resistor 12 may be implemented using existing metal wiring like a seal ring or a crack stop ring. In other embodiments, other implementations for resistor 12 may be used. Resistor 12 may have a comparatively high area, such that it may carry high currents (for example also in case of electrostatic discharge (ESD) events).

In some embodiments, when high voltages are applied to terminal 13 (for example in an ESD case) a tunnel current may flow through a dielectric material insulating resistor 12, e.g. to a substrate of the chip. This additional current may deviate some of the charge of the ESD event and may in embodiments therefore serve as additional ESD protection. In other words, the tunneling current causes a voltage drop at the resistor which limits a voltage at the second terminal of resistor 12.

Furthermore, optionally, the terminal circuitry may comprise a buffer capacitor 14 coupled e.g. between a second terminal of resistor 12 and ground. In other embodiments, buffer capacitor 14 may be omitted. It should be noted that buffer capacitor 14 may be directly or indirectly coupled with the second terminal of resistor 12. While buffer capacitor 14 is shown as part of chip 10 in FIG. 1, in other embodiments, buffer capacitor 14 may be an external capacitor provided inside or outside a package of chip 10.

The second terminal of resistor 12 is further coupled with circuitry 11. Circuitry 11 may comprise any kind of circuitry needed on chip 10 for a particular application. For example, circuitry 11 may comprise ESD protection circuitry, core circuitry implementing functions chip 10 is intended for, for example sensor functions or signal processing functions, and/or may comprise any other kind of desired circuitry like voltage or current regulators. Some more detailed embodiments illustrating examples for circuitry 11 will be discussed further below.

By using internal resistor 12 on chip 10, optionally in combination with buffer capacitor 14, conventional external circuitry or at least an external resistor for filtering disturbance pulses may be omitted or at least reduced in some embodiments.

Figure 2:
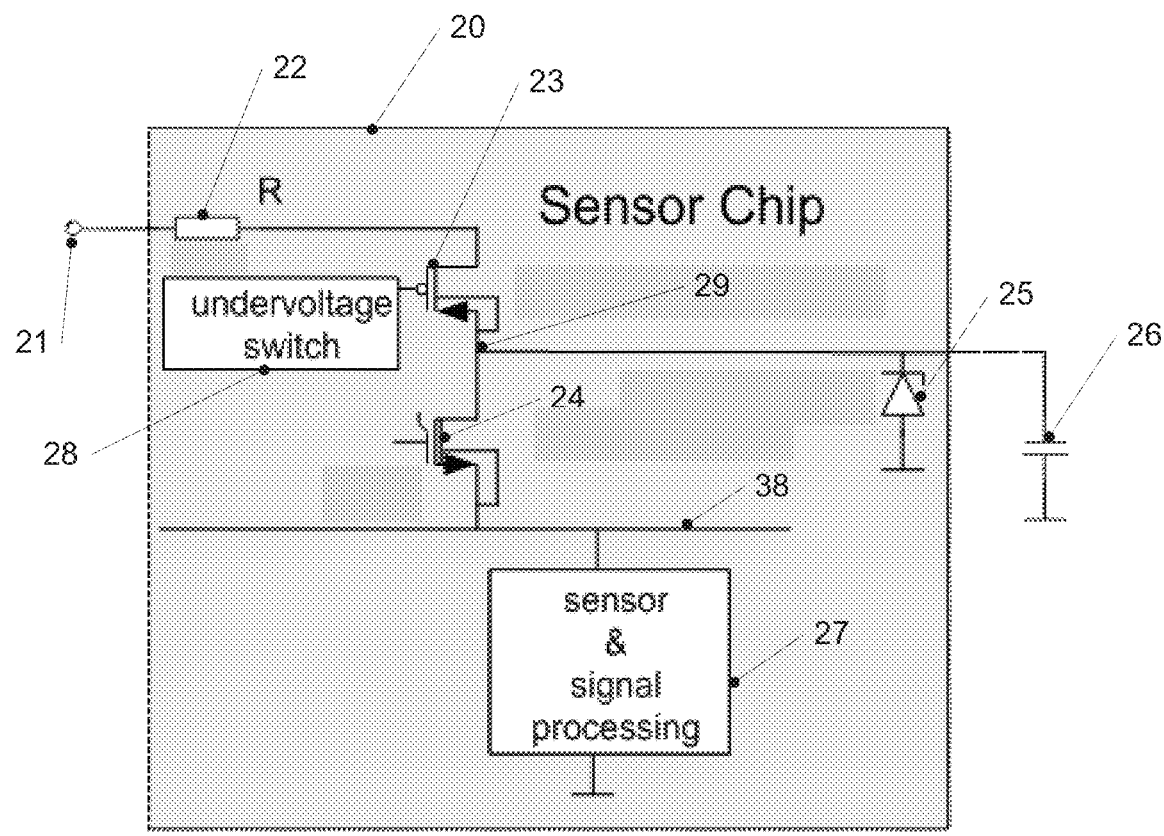
FIG. 2 is a block diagram of a device according to a further embodiment.

FIG. 2 illustrates a more detailed block diagram of a device according to an embodiment. The device of FIG. 2 comprises a sensor chip 20. Components of sensor chip 20 may be integrated in a single integrated circuit in some embodiments. Sensor chip 20 comprises a terminal 21, which in the embodiment of FIG. 2 is a supply voltage terminal for receiving a positive supply voltage, for example VDD. While a single terminal 21 is shown for illustration purposes, further terminals (not shown in FIG. 2) may be provided, for example input-output (I/O) terminals.

Sensor chip 20 furthermore comprises a resistor 22. A first terminal of resistor 22 is coupled with terminal 21. In the embodiment of FIG. 2, the first terminal of resistor 22 is directly coupled with terminal 21, i.e. without intervening elements. In embodiments, in particular no ESD protection devices are directly coupled with the first terminal of resistor 22. In embodiments, this prevents a current path other than a path to resistor 22 from becoming conductive (for example an ESD path in case of an ESD event). Resistor 22 may be implemented as discussed for resistor 12 of FIG. 1 and may for example have a resistance greater than 5Ω, for example between 10 and 100Ω, for example about 30Ω.

A second terminal of resistor 22 is coupled with a switch 23, which in the example shown may be implemented comprising a PMOS transistor. An undervoltage detection circuit 28 may detect an undervoltage at terminal 21 and/or at the second terminal of resistor 22 and set switch 23 to a high ohmic state in case an undervoltage is detected, i.e. the voltage at terminal 21 being below a predetermined threshold. In other embodiments, additionally or alternatively other undesired voltage conditions may be detected, for example an overvoltage. By setting switch 23 to a high ohmic state (i.e. opening switch 23) in such a case, terminal 21 and resistor 22 are effectively decoupled from the rest of the circuit of sensor chip, such that a disturbance terminal 21 like an undervoltage cannot propagate through the circuit.

Such a function of switch 23 may also be referred to as active reverse current protection. In some embodiments, switch 23 may be implemented as a low drop switch which has a low voltage drop when in a low ohmic condition (i.e. a closed condition of the switch).

In addition to undervoltage detection circuit 28 and switch 23 or as an alternative thereto, a buffer capacitor may be provided to suppress under-voltage disturbances and high frequency noise at the same time (for example by forming a low pass filter together with series connected resistor 22 and an inherent resistance of a reverse protecting switch).

In particular, in the example of FIG. 2, a first load terminal of switch 23 (for example source or drain) is coupled with the second terminal of resistor 22, and a second load terminal of switch 23 (for example the other one of source or drain) is coupled with a node 29. Node 29 is further coupled with ESD protection circuitry, represented by an ESD protection diode 25. However, diode 25 is merely an example for ESD protection circuitry, and any conventional ESD protection circuitry may be used.

Furthermore, a buffer capacitor 26 is coupled with node 29 as illustrated in FIG. 2. In FIG. 2, buffer capacitor 26 is illustrated as an external capacitor provided external to chip 20. In other embodiments, buffer capacitor 26 may be an internal capacitor integrated on chip 20. Buffer capacitor 26 may for example have a capacitance value between 0.1 µF and 2 µF, for example between 0.3 µF and 1 µF, but is not limited thereto.

Buffer capacitor 26 may serve as a voltage source which keeps a voltage at node 29 at or near a desired value for at least a short time when switch 23 is opened for example due to an undervoltage or other disturbance of a supply voltage at terminal 21. In particular, charge stored on capacitor 26 may essentially serve as such a voltage source during such a disturbance. With such an embodiment, an effect of micro breaks in the supply voltage or of low ohmic negative voltage peaks may be mitigated. In some embodiments, in this case a circuit like circuit 27 to be described later may be kept functioning during such disturbances. For example, switching without loosing edges or without phase error, updating values of an analog-to-digital converter or of an output voltage may be maintained, to give some examples.

Furthermore, chip 20 comprises a voltage regulator like a low dropout voltage regulator, which in the schematic representation of FIG. 2 is represented as a transistor 24. A low dropout voltage regulator is a voltage regulator which requires a comparatively small difference between an input voltage and an output voltage, for example smaller than 0.6V or smaller than one diode threshold. Any conventional implementation of a voltage regulator, for example a low dropout regulator, may be used.

Voltage regulator 24 provides a regulated internal voltage, for example between 1 V and 5 V, for example of about 2.4 V, on an internal supply voltage rail 28 based on the positive supply voltage received at terminal 21. In the example of FIG. 2, sensor and signal processing circuit 27 is coupled with internal supply voltage rail 38 to perform sensor and signal processing functions. Sensor and signal processing circuitry 27 may be implemented in any conventional manner and is merely example for core circuitry implementing functions chip 20 is intended for. The techniques disclosed herein, for example providing resistor 22 and/or buffer capacitor 26, may also be applicable to other kinds of core circuitry implementing other desired functions of a chip.

In some embodiments, undervoltage detection circuit 28 may also control sensor and signal processing circuitry 27 to switch to a specific mode of operation like low power mode, hold mode or partial reset mode in case an undervoltage is detected. In embodiments, this may prolong a time that the buffer capacitor 26 is able to supply sensor and signal processing circuitry 27 with power. The under-voltage detection may be related to a ground pin or to a buffer capacitor voltage. For instance, the undervoltage detection may detect if a voltage at terminal 21 (e.g. VDD) drops below a threshold value, e.g. about 2V, and/or may detect if the voltage at terminal 21 drops below a buffer capacitor voltage (e.g. voltage at buffer capacitor 26)

In such an embodiment, the circuit may be able to cope with connections to terminal 13 having a wrong polarity, as a reverse current which may flow in such a case is limited by resistor 12.

Figure 3:
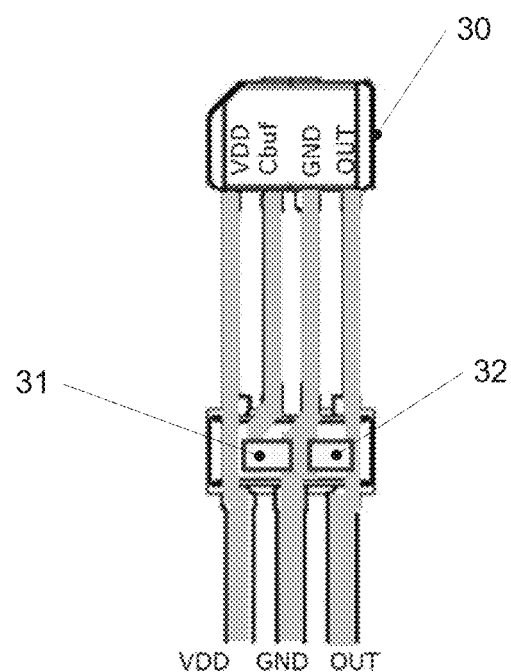
FIG. 3 is a diagram illustrating implementations of buffer capacitors.

FIG. 3 illustrates an implementation example of an external buffer capacitor coupled between a capacitor terminal Cbuf and ground. In FIG. 3, 30 denotes a chip diode or an active reverse protecting switch provided in a package. As an example, terminals VDD for a positive supply voltage, Cbuf for coupling the buffer capacitor, GND for ground and OUT for an output terminal as shown. Numeral 31 denotes a buffer capacitor coupled between terminal Cbuf and ground and may be an example for capacitor 26 of FIG. 2. Numeral 32 denotes for example a further capacitor between an output terminal OUT and ground. Terminal Cbuf is not provided to the outside of the chip (as illustrated in a lower part of FIG. 3, only VDD, GND and OUT are provided as output terminals) and is therefore not susceptible to external disturbance pulses.

Figure 4:
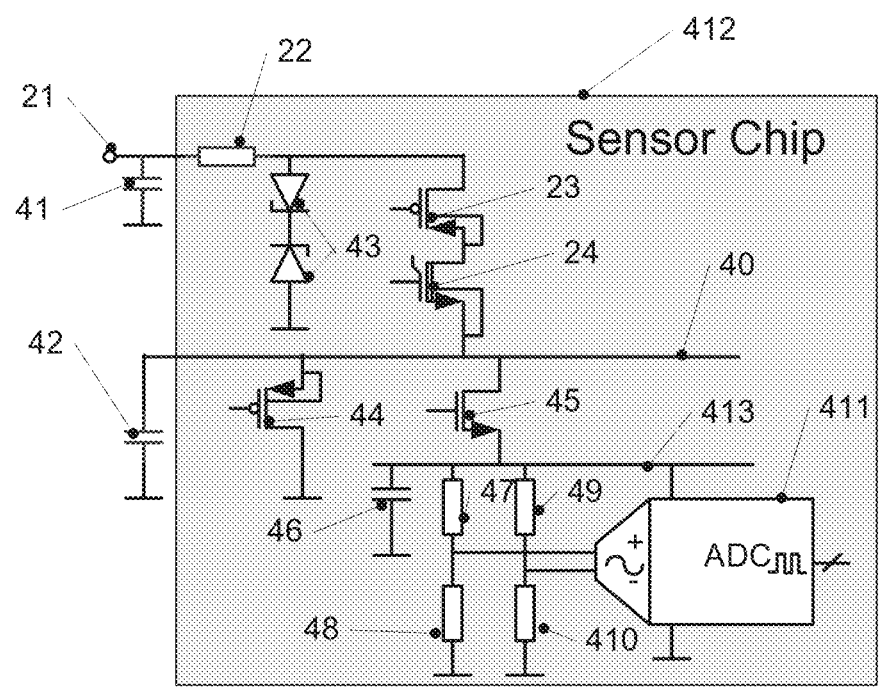
FIG. 4 is a block diagram illustrating a device according to a further embodiment.

FIG. 4 illustrates a device according to a further embodiment. In order to avoid repetitions, elements in the embodiment of FIG. 4 which at least essentially correspond to elements in the embodiment of FIG. 2 bear the same reference numerals and will not be described again in detail. However, this is not to be construed as implying that these elements need to be exactly identical.

The embodiment of FIG. 4 comprises a sensor chip 412. Sensor chip 412 comprises a terminal 21 which may be a positive supply voltage terminal as discussed with reference to FIG. 2. Sensor chip 412 furthermore comprises a resistor 22, which may be implemented as discussed for resistor 22 of FIG. 2 or resistor 12 of FIG. 1. A first terminal of resistor 22 is directly coupled with terminal 21. Furthermore, an external buffer capacitor 41 is coupled with terminal 21. Capacitor 41 may have for example a capacitance in the range of 0.1 to 2 µF, for example between 0.3 and 1 µF.

A second terminal of resistor 22 is coupled to a switch 23 which may for example be controlled by an undervoltage detection circuit (like undervoltage detection circuit 28 of FIG. 2, not shown in FIG. 4) and to a voltage regulator 24, for example a low drop voltage regulator, to provide a regulated voltage on a supply rail 40. Furthermore, the second terminal of resistor 22 is coupled with ESD protection circuitry 43, represented as two diodes in case of FIG. 4. Again, any conventional ESD protection circuitry may be provided.

Supply voltage rail 40 is coupled with an external buffer capacitor 42, for example having a value of the order of 1 µF, but not limited thereto. Buffer capacitor 42 may serve a similar function as buffer capacitor 26 of FIG. 2 and may provide a voltage supply to bridge disturbances of a supply voltage at terminal 21. As an example, sensor chip 412 further comprises a switch 45 selectively coupling supply rail 40 to a further supply rail 413, which for example may have a lower voltage than on supply rail 40. For example, a voltage on supply rail 40 may be about 4.3 V, and a voltage on further supply rail 413 may be about 2.4 V, although these values serve only as examples and may differ in other embodiments. Furthermore, the sensor chip 412 comprises an EMC shunt transistor 44 to protect rail 40 against EMC events.

Coupled to further supply rail 413 is a capacitor 46. Capacitor 46 may additionally serve to mitigate disturbances on further supply rail 413. A resistive bridge comprising resistors 47, 48, 49, 410 is also coupled between further supply rail 413 and ground. The resistive bridge may serve to sense a desired quantity and is an example for a sensor. For example, resistors 47, 48, 49, 410 may comprise magnetoresistive elements to sense a magnetic field. Nodes of the resistive bridge are coupled to input terminals of an analog-to-digital converter (ADC) 411 as shown in FIG. 4. ADC 411 is supplied by the further supply rail 413. An output signal of ADC 411 may correspond to a digital representation of the sensed quantity and may for example be output at an I/O terminal (not shown in FIG. 4). Resistors 47, 48, 49, 410 and ADC 411 serve merely as illustrative example of a sensor circuit, and other circuits, e.g. other sensor circuits, may also be used.

Core circuitry like sensor and signal processing circuitry (for example 27 of FIG. 2, not shown in FIG. 4, or 11 of FIG. 1) may be coupled to supply rail 40 and/further supply rail 413 to be supplied with voltage.

The above-described embodiments serve merely as examples and variations are possible. In particular, the configurations using voltage regulators and/or sensor and signal processing circuitry 27 serve merely as examples of circuitry coupled to a resistor like resistor 12 or resistor 22, and other circuits may also be used.

We claim:

1. A device, comprising:
a chip, the chip comprising:
a terminal, wherein the terminal of the chip is a supply voltage terminal;
a resistor, a first terminal of the resistor being coupled with the terminal of the chip, a second terminal of the resistor being coupled with
a first terminal of a switch such that the resistor is coupled in series between the terminal of the chip and the first terminal of the switch;
a control circuitry controlling the switch, wherein the control circuitry is adapted to open the switch in case of a disturbance of a supply voltage supplied to the first terminal, wherein the control circuitry is coupled with a second, different terminal of the switch, and wherein the second terminal of the resistor is coupled to the first terminal of the switch not via the control circuitry; and
a voltage regulator coupled to the switch to provide a regulated internal voltage for the chip;
the device further comprising a buffer capacitor to provide another supply voltage in case of a disturbance of the supply voltage at the terminal of the chip.

2. The device of claim 1, wherein the first terminal of the resistor is directly coupled with the terminal of the chip.

3. The device of claim 1, further comprising ESD circuitry, the ESD circuitry being coupled with the second terminal of the resistor and being coupled with the first terminal of the resistor only via the resistor.

4. The device of claim 1, wherein a resistance value of the resistor is greater than 5Ω.

5. The device of claim 1, wherein the buffer capacitor is provided external to the chip.

6. The device of claim 1, wherein the control circuitry is adapted to open the switch to disconnect the supply voltage terminal from the capacitor in case of a disturbance of the supply voltage at the supply voltage terminal.

7. The device of claim 1, wherein the resistor is a dielectrically isolated resistor.

8. The device of claim 1, wherein the resistor is implemented in at least one metal layer of the chip.

9. The device of claim 1, wherein the resistor is a passive resistor.

10. The device of claim 1, wherein the voltage regulator comprises a low dropout voltage regulator.

11. The device of claim 1, wherein the chip comprises sensor circuitry.

12. An integrated circuit, comprising:
a supply voltage terminal,
a resistor, a first terminal of the resistor being directly coupled to the supply voltage terminal, and a second terminal of the resistor being coupled to a first terminal of a switch such that the resistor is coupled in series between the supply voltage terminal and the first terminal of the switch;
one of a capacitor terminal to be coupled with an external capacitor external to the integrated circuit or an internal capacitor coupled with a second terminal of the resistor,
a control circuitry, the control circuitry being configured to open the switch in case of a disturbance of a supply voltage at the supply voltage terminal to decouple the supply voltage terminal and the resistor from the at least one of the capacitor terminal or internal capacitor, wherein the control circuitry is coupled with a second, different terminal of the switch, and wherein the second terminal of the resistor is coupled to the first terminal of the switch not via the control circuitry,
a voltage regulator coupled to the switch to provide a regulated internal voltage for the integrated circuit, and
a core circuitry implementing at least one function of the integrated circuit coupled to the resistor via the second terminal of the resistor.

13. The integrated circuit of claim 12, wherein the at least one of the capacitor terminal or internal capacitor is coupled with an internal supply rail of the integrated circuit.

14. The integrated circuit of claim 12, wherein the voltage regulator is coupled between the supply voltage terminal and an internal supply rail.

15. The integrated circuit of claim 12, further comprising dielectric material surrounding the resistor, a thickness of the dielectric material being such that it allows a tunneling current to flow in case of an electrostatic discharge (ESD) event at the supply voltage terminal.

* * * * *